(12) United States Patent
Sakai (10) Patent No.: US 7,967,395 B2
(45) Date of Patent: Jun. 28, 2011

(54) BRAKING PRESSURE CONTROL UNIT FOR VEHICLE BRAKING SYSTEM

(75) Inventor: Moriharu Sakai, Kariya (JP)

(73) Assignee: Advics Co., Ltd., Kariya, Aichi-Pref. (JP)

( * ) Notice: Subject to any disclaimer, the term of this patent is extended or adjusted under 35 U.S.C. 154(b) by 967 days.

(21) Appl. No.: 11/830,193

(22) Filed: Jul. 30, 2007

(65) Prior Publication Data

US 2008/0036291 A1 Feb. 14, 2008

(30) Foreign Application Priority Data

Aug. 11, 2006 (JP) ................. 2006-220126

(51) Int. Cl.
*B60T 8/36* (2006.01)
(52) U.S. Cl. ............ 303/119.3; 303/116.4; 303/DIG. 10
(58) Field of Classification Search ............... 303/116.4, 303/119.2, 119.3, DIG. 10
See application file for complete search history.

(56) References Cited

U.S. PATENT DOCUMENTS

| | | | |
|---|---|---|---|
| 5,275,478 A * | 1/1994 | Schmitt et al. ............. | 303/119.2 |
| 6,113,197 A | 9/2000 | Kuroki et al. | |
| 7,578,564 B2 * | 8/2009 | Sakai ...................... | 303/119.3 |
| 2005/0265852 A1 | 12/2005 | Nakazawa | |
| 2006/0017321 A1 * | 1/2006 | Tsunooka ................. | 303/119.3 |
| 2007/0090689 A1 * | 4/2007 | Kempf ...................... | 303/116.4 |

FOREIGN PATENT DOCUMENTS

| | | | |
|---|---|---|---|
| FR | 2710699 A3 * | 4/1995 | |
| JP | 09-150722 A | 6/1997 | |
| JP | 10-129445 A | 5/1998 | |
| JP | 10-203338 A | 8/1998 | |
| JP | 11-165626 A | 6/1999 | |
| JP | 2005096592 A * | 4/2005 | |
| JP | 2005-231398 A | 9/2005 | |
| JP | 2006-8107 A | 1/2006 | |

OTHER PUBLICATIONS

Examination Report dated Sep. 24, 2010, issued by the German Patent Office in corresponding German patent application No. 10 2007 000 435.6, and English language translation of a portion of the Examination Report.
Official Action dated Mar. 15, 2011, issued by the Japanese Patent Office in corresponding Japanese Patent Application No. 2006-220126.

* cited by examiner

*Primary Examiner* — Bradley T King
(74) *Attorney, Agent, or Firm* — Buchanan Ingersoll & Rooney PC (57) ABSTRACT

In braking pressure control unit for a vehicle braking system, a space is formed, which is neighboring to electric brushless motors and arranged at ends of electromagnetic valves in a direction of a motor shaft of the electric motor. A printed circuit board for a motor driving circuit and a printed circuit board for a valve control circuit are arranged side-by-side in the space in the direction of the motor shaft. As a result, a longitudinal direction of the braking pressure control unit is suppressed to a small amount.

11 Claims, 4 Drawing Sheets

BRAKING PRESSURE CONTROL UNIT FOR VEHICLE BRAKING SYSTEM

CROSS REFERENCE TO RELATED APPLICATION

This application is based on Japanese Patent Application No. 2006-220126 filed on Aug. 11, 2006, the disclosure of which is incorporated herein by reference.

FIELD OF THE INVENTION

The present invention relates to a braking pressure control unit for a vehicle braking system, which has multiple pumps and multiple electric motors for driving the multiple pumps, wherein brake fluid is drawn by the pumps to supply the same to wheel cylinders of a vehicle such that brake fluid pressure for the respective wheel cylinders is controlled in accordance with control signals from an electronic control unit.

BACKGROUND OF THE INVENTION

A braking pressure control unit is applied to a vehicle braking system, which generally has a function for an anti-lock braking control (ABS), a function for a vehicle stability control (ESC), and so on. The braking pressure control unit is composed of a combination of a hydraulic pressure control block in which a pump and electromagnetic valves are assembled in a housing thereof, an electric motor for driving the pump, and an electronic control unit having a motor driving circuit and a valve control circuit. A valve which controls the brake fluid pressure in the respective wheel cylinders can be used as the above electromagnetic valve. A pressure sensor and other electrical parts may be also assembled to the braking pressure control unit, as the case may be. A braking pressure control unit of this kind is disclosed, for example, in Japanese Patent Publication No. H10-129445 or No. H11-165626.

In the braking pressure control unit disclosed in the above Japanese Patent Publication No. H10-129445 or No. H11-165626, each of two systems for the brake fluid circuits has two pumps, which are driven by one electric motor. The electric motor and an electronic control unit are arranged in a direction of a motor shaft. In the braking pressure control unit disclosed in the above Japanese Patent Publication No. H10-129445, an electronic control unit is integrally formed with an electric motor, wherein a printed circuit board is fixed to a part of the electric motor. In the braking pressure control unit disclosed in the above Japanese Patent Publication No. H11-165626, an electric motor for driving a pump and electromagnetic valves (coil portions thereof) are arranged at one side of a housing for a hydraulic pressure control block, in such a manner that the electric motor and the electromagnetic valves are not overlapped with each other. The type of the electric motor is not explained in the above Japanese Patent Publication No. H11-165626.

Another Japanese Patent Publication No. H10-203338 discloses a vehicle braking system of a brake-by-wire type, in which a plurality of pumps (generally, four pumps) are provided for each of wheel cylinders, those pumps are divided and arranged for the two systems of brake fluid circuits, and those pumps are driven by two electric motors.

The braking pressure control unit is generally mounted in an engine compartment of a vehicle. Therefore, when a size of the braking pressure control unit becomes larger, it may cause a problem that the braking pressure control unit will not be easily mounted in the engine compartment due to a lack of a space therefor. It is, therefore, important to make the size of the braking pressure control unit as smaller as possible. In the above explained braking pressure control unit (Japanese Patent Publication No. H10-129445 or No. H11-165626), in which the electric motor and the electronic control unit are arranged in the direction of the motor shaft, a longitudinal length of the braking pressure control unit becomes inevitably longer and may be affected by space limitations for the engine compartment.

In a structure, in which the electric motor and the electronic control unit are integrally provided it may become a problem that electrical or electronic parts included in the electronic control unit are deteriorated due to heat generated at the electric motor.

In the conventional braking system, as disclosed in the above Japanese Patent Publication No. H10-203338, numbers of the electric motors and pumps are increased compared with the other braking systems, the size of the braking pressure control unit becomes inevitably larger and it is more likely to be affected by the space limitations for the engine compartment.

It is proposed to use a brushless motor for the braking pressure control unit, in place of a brush-type motor for driving the pump. Since the brushless motor is superior to the brush-type motor in its response, a pressure increasing speed is increased and a response for braking operation can be improved, when the brushless motor is used. However, the brushless motor requires electrical parts, such as a condenser and a coil, which are necessary for a noise filter and generally large in size. When the electronic control unit, in which such electrical parts having large sizes are included, is arranged at one side of the electric motor in the motor shaft direction, the length of the braking pressure control unit becomes further longer. And such braking pressure control unit is easily affected by the space limitations for the engine compartment.

The problem of the deterioration for the electronic parts due to the heat generated by the electric motor may be solved by the electric motor and the electronic control unit, which are separately formed from each other and arranged at both sides of the braking pressure control unit. In such a structure, however, the electric connection between the electric motor and the electronic control unit become very complicated. In addition, it causes a problem that the size of the braking pressure control unit becomes much larger due to the complicated wiring arrangement.

The brushless motor generally has three lines for electric power supply and five lines for control signals. In the case that two brushless motors are used, a total of sixteen wires should be formed from a wire harness, for which countermeasure for noise suppression is necessary. When the electric (brushless) motors and the electronic control unit are arranged at opposite sides of the braking pressure control unit, they are connected by the above wire harness. Accordingly, the increase of the size of the braking pressure control unit, which is also caused by the increase of the wire harness, becomes much larger.

SUMMARY OF THE INVENTION

The present invention is made in view of the foregoing problems, and has an object to provide a braking pressure control unit for a vehicle, in which a plurality of pumps and a plurality of electric motors are provided, a size of the braking pressure control unit is made smaller without causing deterioration of electrical parts, and a brushless motor is used for the electric motor.

According to one of features of the present invention, a braking pressure control unit for a vehicle braking system has a plurality of pumps for respectively drawing brake fluid and for supplying the brake fluid to respective wheel cylinders. The braking pressure control unit has a hydraulic pressure control block, which includes, first electromagnetic valves for opening or closing brake fluid lines, which connect a master cylinder with the wheel cylinders, second electromagnetic valves for opening or closing brake fluid passages, which connect the wheel cylinders to a reservoir, and third electromagnetic valves for controlling fluid pressure of the brake fluid in the respective wheel cylinders, wherein valve portions of the electromagnetic valves and the pumps are arranged in a housing for the braking pressure control unit. The braking pressure control unit has furthermore a plurality of electric motors for respectively driving the pumps, and an electronic control unit for outputting control signals to the respective electromagnetic valves and to the electric motors for driving the pumps.

In the above braking pressure control unit, the electromagnetic valves are put together in a group and arranged at one side of the hydraulic pressure control block, and the electric motors are put together in a group and arranged at the same one side of the hydraulic pressure control block, so that the group for the electromagnetic valves and the group for the electric motors are arranged close to each other on the same side of the hydraulic pressure control block.

Furthermore, a space, which is neighboring to the electric motors and which is arranged at a position at ends of the electromagnetic valves in a direction of a motor shaft of the electric motor, is formed. The electronic control unit is composed of a printed circuit board having a motor driving circuit for the electric motors, a printed circuit board having a valve control circuit for the electromagnetic valves, and a casing for accommodating the printed circuit boards, and the printed circuit boards are arranged in the space side by side in the direction of the motor shaft.

According to other features of the present invention, the braking pressure control unit has the following additional features.

(1) The electromagnetic valves and the electric motors are arranged at a steep side surface of the housing for the hydraulic pressure control block. The electric motors are arranged side by side below the group for the electromagnetic valves, so that each of the electric motors is neighboring to each other in a horizontal direction. And terminals for electric power supply to the electric motors and terminals for control signals to the electric motors are provided in such an area of an outer periphery of each of the electric motors, which has an angular range less than ±40° in a circumferential direction of the electric motor from a reference line, that is a vertical line passing through a rotational center of the electric motor.

(2) The electric motors are composed of brushless motors. The motor driving circuit for the brushless motor includes a noise filter being composed of a condenser and a coil. And the condenser and the coil are fixed to the printed circuit board for the motor driving circuit, and arranged between the printed circuit boards.

(3) Terminals for electric power supply to the electric motors and terminals for control signals to the electric motors are directly fixed to corresponding portions of the motor driving circuit formed on the printed circuit board.

(4) The coil portions of the electromagnetic valves and the electric motors are accommodated in the casing for the electronic control unit, together with the printed circuit board for the motor driving circuit and the printed circuit board for the valve control circuit.

(5) The housing is made of aluminum or aluminum-based material. The heat radiation plate is fixed to the housing. And transistors included in the respective motor driving circuit and valve control circuit are supported by the heat radiation plate.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

An embodiment of the present invention will be explained with reference to FIGS. 1 to 4 of the attached drawings.

For the convenience sake of the explanation, sub reference numerals (such as -1, -2, and so on) are added to respective main reference numerals, when there are a plurality of components which are identical or similar to each other, e.g. electromagnetic valves, pumps, and so on. The sub reference numerals are added to the main reference numerals so that the components having the same main reference numerals are distinguished from each other.

Figure 1:
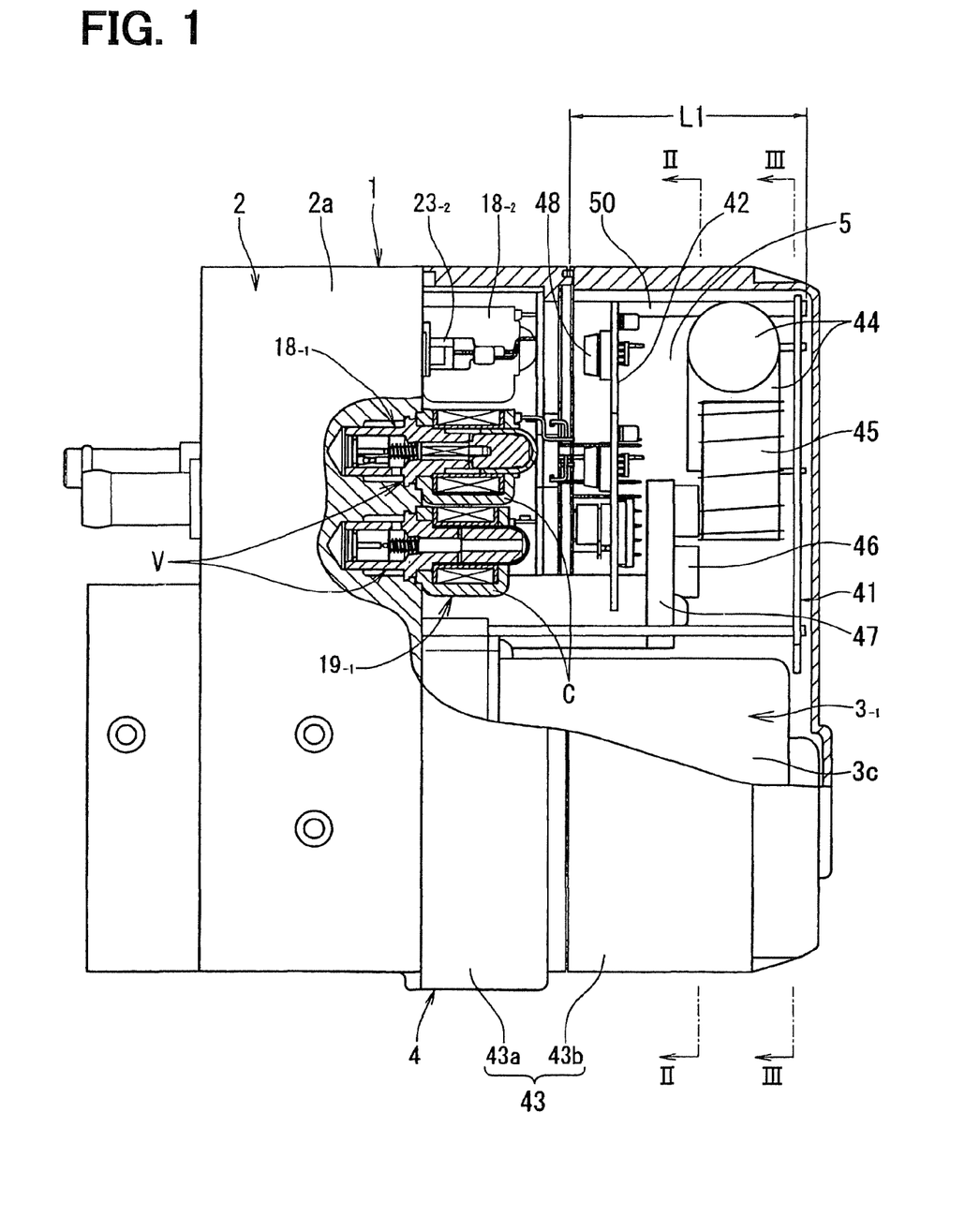
FIG. 1 is a schematic side view, including a partial cross sectional view, showing a braking pressure control unit according to an embodiment of the present invention.
Figure 2:
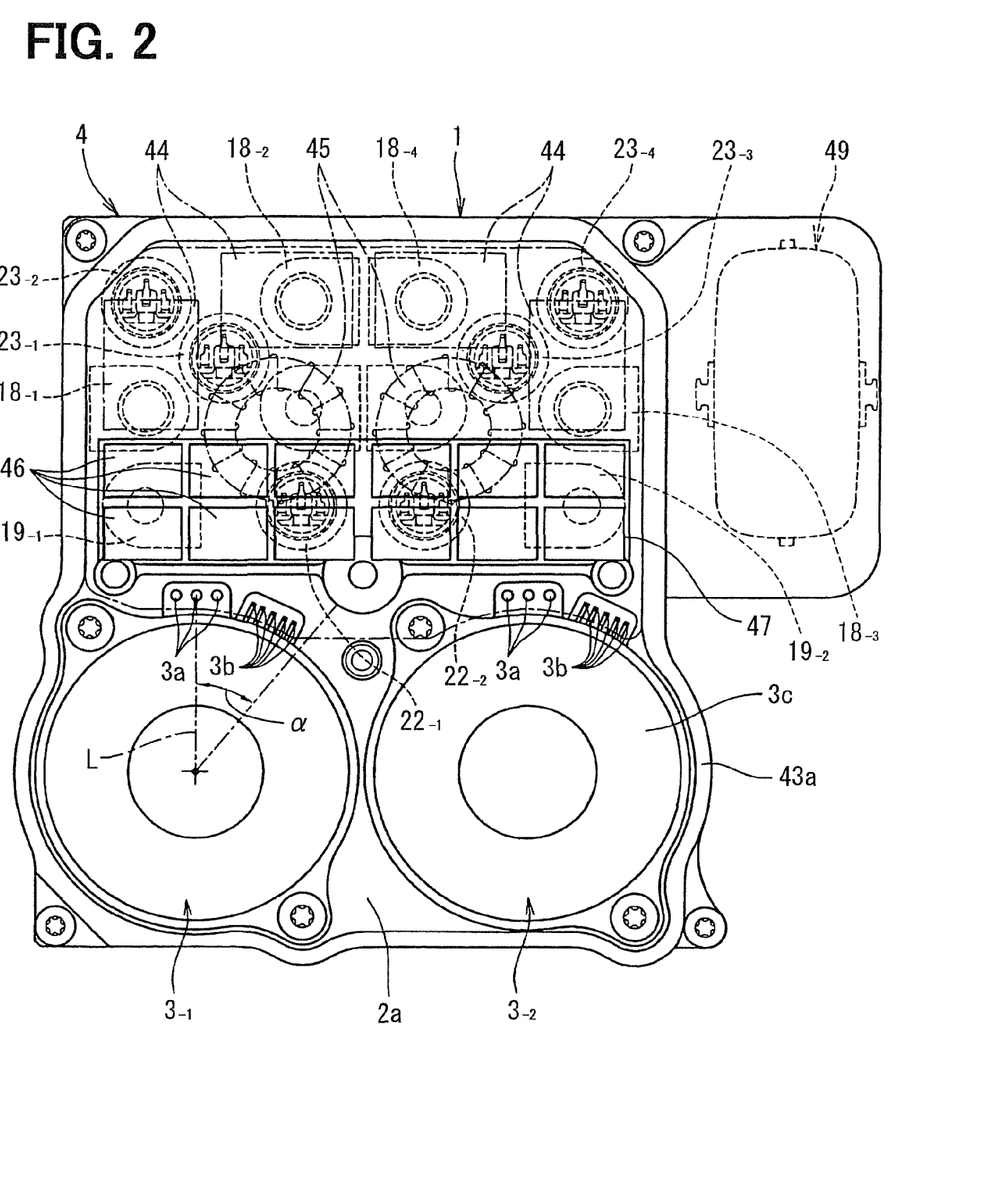
FIG. 2 is a cross sectional view taken along a line II-II in FIG. 1.
Figure 3:
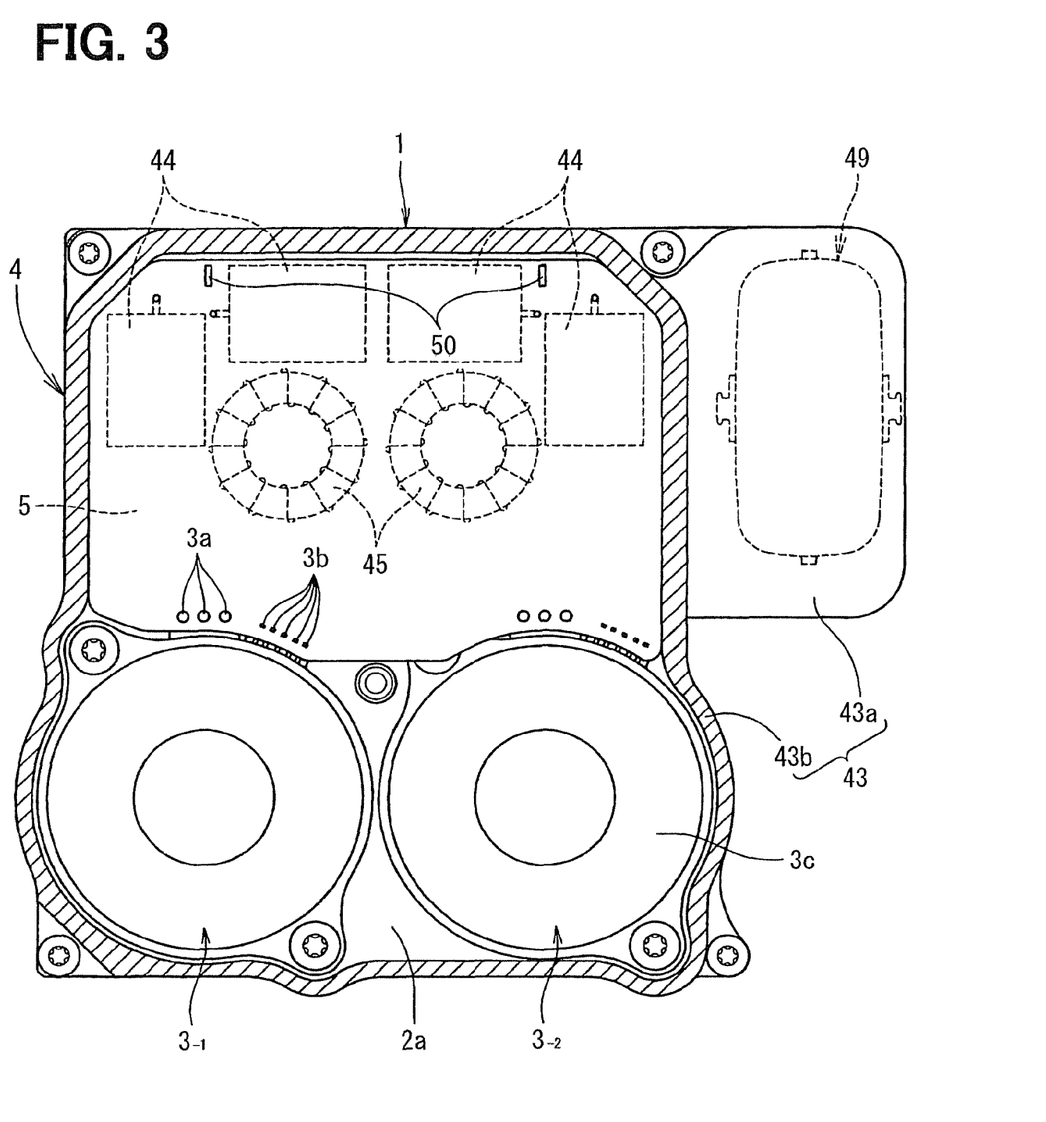
FIG. 3 is a cross sectional view taken along a line III-III in FIG. 1.

FIGS. 1 to 3 respectively show a braking pressure control unit 1 for a vehicle braking system according to the embodiment of the present invention. The braking pressure control unit 1 is composed of a hydraulic pressure control block 2, electric motors 3-1 and 3-2, and an electronic control unit (ECU) 4.

Figure 4:
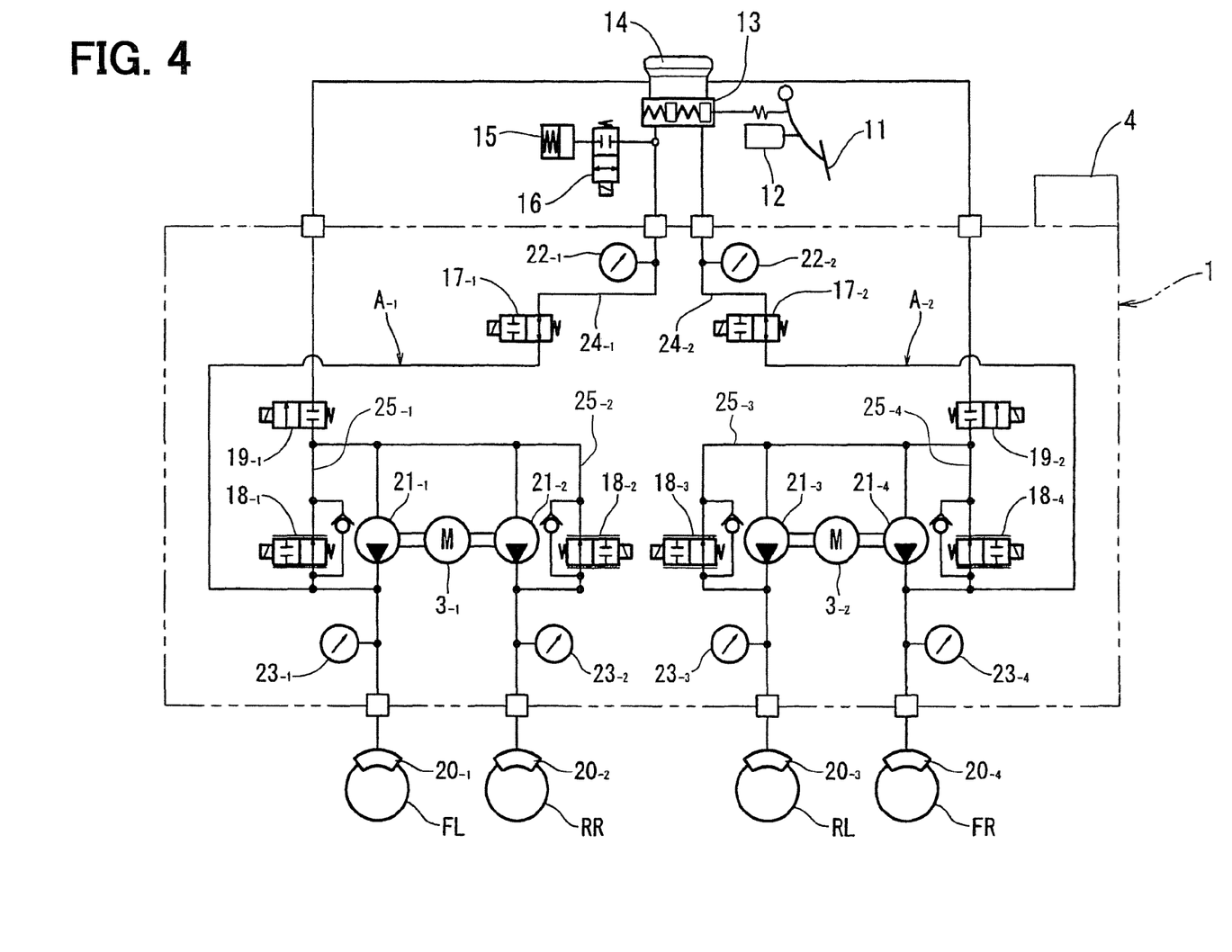
FIG. 4 is a schematic diagram showing an example of a hydraulic circuit for a vehicle braking system having a function of a brake-by-wire operation.

FIG. 4 shows an example of a hydraulic circuit for the vehicle braking system, which is a so-called brake-by-wire type braking system having multiple (four) pumps for each of four wheel cylinders and multiple (two) electric motors for respectively driving the four pumps. The braking pressure control unit 1 shown in FIGS. 1 to 3 is applied to the vehicle braking system shown in FIG. 4. Therefore, the vehicle braking system shown in FIG. 4 will be explained at first.

In FIG. 4, a reference numeral 11 designates a brake operation means (e.g. a brake pedal in the drawing), a reference numeral 12 designates a pedal force sensor for detecting force on the brake pedal 11 (the pedal force sensor may be replaced by a pedal stroke sensor for detecting an operated stroke of the brake pedal 11), a reference numeral 13 designates a master cylinder of a tandem type having a reservoir 14 for the master cylinder, a reference numeral 15 designates a stroke simulator, and a reference numeral 16 designates an electromagnetic valve for a stroke control (also referred to as a stroke control valve 16).

Numerals 17-1 and 17-2 designate normally opened electromagnetic valves (ON-OFF valves), numerals 18-1 to 18-4 designate electromagnetic valves (linear control valves) for controlling brake fluid pressure applied to respective wheel cylinders in accordance with control signals, and numerals 19-1 and 19-2 designate normally closed electromagnetic valves (ON-OFF valves).

Numerals 20-1 to 20-4 designate wheel cylinders for respective vehicle wheels (FR is a front right wheel, FL is a front left wheel, RR is a rear right wheel, and RL is a rear left wheel). Numerals 21-1 to 21-4 designate pumps provided for each of the wheel cylinders 20-1 to 20-4. Numerals 22-1 and 22-2 and numerals 23-1 to 23-4 designate pressure sensors.

The above explained vehicle braking system has a so-called X-pipe-arrangement, in which a first brake fluid circuit A-1 is connected to the wheel cylinders 20-1 and 20-2 for the front-left wheel FL and the rear-right wheel RR, whereas a second brake fluid circuit A-2 is connected to the wheel cylinders 20-3 and 20-4 for the rear-left wheel RL and the front-right wheel FR. In the vehicle having the above braking system, operations for an anti-lock braking control (ABS), a traction control (TRC), a vehicle stability control (ESC), and so on will be carried out.

The pumps 21-1 and 21-2 are incorporated in the first brake fluid circuit A-1, whereas the pumps 21-3 and 21-4 are incorporated in the second brake fluid circuit A-2. The pumps 21-1 and 21-2 and the pumps 21-3 and 21-4 are tandem-type pumps, each of which is respectively operated by electric motors 3-1 and 3-2.

Each of the first and second brake fluid circuits A-1 and A-2 has a brake fluid line 24-1, 24-2 for communicating the master cylinder 13 with the wheel cylinders 20-1 to 20-4, and a brake fluid passage 25-1 to 25-4 for connecting the wheel cylinders 20-1 to 20-4 to the reservoir 14. The electromagnetic valves 17-1 and 17-2 are provided in the respective brake fluid lines 24-1 and 24-2. The stroke simulator 15 and the stroke control valve 16 are provided in the brake fluid line 24-1 at an upstream side of the electromagnetic valve 17-1, namely on a side to the master cylinder 13. The pumps 21-1 to 21-4 are arranged in the brake fluid circuits A-1 and A-2 at downstream sides of the electromagnetic valves 17-1 and 17-2, namely at a side to the wheel cylinders. The brake fluid drawn by the pumps 21-1 to 21-4 is supplied to the respective wheel cylinders 20-1 to 20-4.

The electromagnetic valves 18-1 to 18-4 are provided in the brake fluid passages 25-1 to 25-4 connecting the wheel cylinders 20-1 to 20-4 to the reservoir 14. The brake fluid passages 25-1 and 25-2 are linked up with each other at an intermediate point (a link-up point) and run together toward the reservoir 14. The brake fluid passages 25-3 and 25-4 are likewise linked up and run together toward the reservoir 14. The electromagnetic valves 19-1 and 19-2 are respectively provided in the brake fluid passages 25-1 to 25-4 between the link-up point and the reservoir 14.

In the above vehicle braking system shown in FIG. 4, the electromagnetic valves 17-1 and 17-2 are closed but the electromagnetic valves 16, 19-1 and 19-2 are opened in accordance with control signals from the electronic control unit 4 (an electronic control circuit of which is formed on a printed circuit board as explained below), when a braking operation is carried out by a vehicle driver and there is no malfunction in the braking system. Furthermore, the closed conditions for the electromagnetic valves 18-1 to 18-4 are maintained. The motors 3-1 and 3-2 are operated to drive the pumps 21-1 to 21-4, so that the pumps draw the brake fluid from the reservoir 14 and supply such brake fluid to the respective wheel cylinders 20-1 to 20-4. As a result, a braking force is applied to the respective wheels. When an automatic braking operation is carried out without any pedal operation by the vehicle driver, the braking force is generated and applied to the respective wheels in the same manner.

The electronic control unit 4 receives information from the various sensors (including the pedal force sensor 12 and the pressure sensors 22 and 23 shown in FIG. 4, a wheel speed sensor (not shown), a yaw-rate sensor (not shown), and an acceleration sensor (not shown) for an acceleration in a vehicle lateral direction, and so on. When the electronic control unit 4 determines, based on the information from the those sensors, that it is necessary to carry out the control for the brake fluid pressure, any corresponding electromagnetic valve(s) (the linear control valves) 18-1 to 18-4 is/are operated so that the brake fluid pressure for the corresponding wheel cylinder 20-1 to 20-4 is controlled.

In the case that one of the first and second brake fluid circuits A-1 and A-2 becomes out-of-order, two vehicle wheels which are diagonally arranged in the other brake fluid circuit (which is in a normal condition) are controlled. In the case that both of the first and second brake fluid circuits A-1 and A-2 become out-of-order and thereby the pressure increase of the brake fluid by the pumps 21-1 to 21-4 can not be achieved, the electromagnetic valves 17-1 and 17-2 are kept opened and the electromagnetic valves 16, 19-1 and 19-2 are kept closed, so that the fluid pressure of the brake fluid generated at the master cylinder 13 is applied to the respective wheel cylinders 20-1 to 20-4, as it is.

The hydraulic pressure control block 2 of the braking pressure control unit 1, which is shown in FIGS. 1 to 3, is composed of the components (except for the electric motors 3-1 and 3-2) framed by a two-dot chain line in FIG. 4, wherein those components are assembled into a housing 2a. The housing 2a has ports (not shown) at its upper portion, which are respectively connected to the master cylinder 13, the reservoir 14, and the wheel cylinders 20-1 to 20-4. Hydraulic passages for the brake fluid (such as the brake fluid circuits A-1 and A-2, the brake fluid lines 24-1 and 24-2, and the brake fluid passages 25-1 to 25-4), which are indicated in FIG. 4 and framed by the two-dot chain line, are formed in an inside of the housing 2a. The pumps 21-1 to 21-4, which are formed as two pairs of the tandem type pumps and arranged in parallel to each other, are also incorporated into the housing 2a. Furthermore, valve portions V of the electromagnetic valves 17-1, 17-2, 18-1 to 18-4, 19-1, and 19-2, and the pressure sensors 22-1, 22-2, and 23-1 to 23-4 are likewise incorporated into the housing 2a.

The electromagnetic valves 17 to 19 are put together in a group and arranged at a specific portion of one side (one steep side) of the hydraulic pressure control block 2. As shown in FIG. 1, the electromagnetic valves 17 to 19 are horizontally incorporated into the hydraulic pressure control block 2, so that coil portions C thereof are protruded outwardly from a side surface of the housing 2a.

The two electric motors 3-1 and 3-2 are arranged side by side below the electromagnetic valves 17 to 19 and fixed to the one side surface of the hydraulic pressure control block 2, wherein the two electric motors 3-1 and 3-2 are horizontally neighboring to each other. According to such an arrangement, a space 5 neighboring to (that is, above) the electric motors 3-1 and 3-2 is formed at ends (right-hand ends in FIG. 1) of the electromagnetic valves in a direction of a motor shaft.

A longitudinal length "L1" of the space 5 in the motor shaft direction is decided by a radius ratio (a ratio of a length versus a radius) of the electric motors 3-1 and 3-2. When the radius ratio is made larger, the longitudinal length "L1" of the space 5 becomes longer, namely a volume of the space 5 becomes larger. Accordingly, the electronic control unit having a larger volume can be accommodated in the space 5 neighboring to the motors 3-1 and 3-2 (the space 5 above the motors 3-1 and 3-2 in the drawing).

In the electric motors 3-1 and 3-2, an inertia becomes smaller and a controllability is increased, when the radius ratio is made larger. It is, therefore, preferable to make the longitudinal length of the space 5 as longer as possible, within a space limitation for mounting the braking pressure control unit 1 in an engine compartment of the vehicle. A motor driving circuit for a brushless motor has electrical parts, such as a condenser, a coil, and the like, which are larger in size than the other electrical parts. However, the volume of the space 5, in which such large-sized electrical parts are accommodated, can be increased by making the longitudinal length "L1" of the space 5 longer. As a result, the space limitation for using the brushless motor is reduced.

In the above embodiment, the brushless motors are used as the electric motors 3-1 and 3-2 for the braking pressure control unit 1. The motor driving circuit for the brushless motor is disclosed, for example, in Japanese Patent No. 3,100,834. The detailed explanation thereof is omitted. In FIGS. 2 and 3, a reference numeral 3a designates terminals for electric power supply for the electric motors 3-1 and 3-2, and a reference numeral 3b designates terminals for the control signals.

The electronic control unit (ECU) 4 is composed of a printed circuit board 41 forming the motor driving circuit, a printed circuit board 42 forming a valve control circuit for the electromagnetic valves 16 to 19, and a casing 43 for accommodating those printed circuit boards 41 and 42. The printed circuit boards 41 and 42 are arranged side by side in the space 5, such that they are neighboring to each other in the motor shaft direction. In FIGS. 2 and 3, the motor driving circuit and the valve control circuit, which are respectively formed on the printed circuit boards 41 and 42, are omitted.

Each of the motor driving circuits formed on the printed circuit board 41 includes large-volumetric condensers 44 and a coil 45, which form a noise filter. The motor driving circuit also includes multiple transistors 46, which are operated as semi-conductor relays.

The condenser 44 and the coil 45 are large-sized electrical parts in the embodiment. However, the condenser 44 and the coil 45 are fixed to one side of the printed circuit board 41, and arranged between the printed circuit boards 41 and 42 in the space 5, which is formed at the position neighboring to the electric motors 3-1 and 3-2 (i.e. above the motors in the drawings). The volume of the space 5 can be changed, as explained above. According to such an arrangement, the braking pressure control unit 1 can be suppressed to a smaller size.

In the braking pressure control unit 1, the volume of the space 5 is optimized by selecting the optimum radius ratio of the motors. In particular, the longitudinal length "L1" of the space 5 is so made that a step between a longitudinal rear end of the motor and a rear end of the space 5 becomes as small as possible "close to zero". Accordingly, space efficiency for the braking pressure control unit 1 is high, and thereby the increase of the size thereof is suppressed.

The transistors 46 are such electrical parts which generate heat during operation. The transistors 46 are arranged at such a position which is separated from the printed circuit boards 41 and 42 for the motor driving circuit and the valve control circuit, and supported by a heat radiation plate 47. The heat radiation plate 47 (which is made of aluminum-based material, e.g. an aluminum plate in the embodiment) is fixed to the housing 2a of the braking pressure control unit 1, which is made of aluminum or aluminum alloy. As the transistors 46 are supported by the heat radiation plate 47, the heat radiation performance is high.

The valve control circuit is formed on the printed circuit board 42 to form an electronic control device 48 for the electromagnetic valves. The electronic control device 48 estimates conditions of the vehicle wheels (a condition toward a wheel lock, a condition recovering from the locked condition, etc) and/or a vehicle behavior (a situation toward an oversteering condition or an under-steering condition), based on the information from the various sensors. And the electronic control device 48 determines whether it is necessary to carry out the control for the brake fluid pressure. When it is the case, any corresponding electromagnetic valve(s) (the linear control valves) is/are operated so that the brake fluid pressure for the corresponding wheel cylinder is controlled.

The valve control circuit also has multiple transistors 46 for driving the electromagnetic valves on or off. Those transistors 46 are likewise supported by the heat radiation plate 47.

The casing 43 is fluid-tightly fixed to the housing 2a, more exactly screwed to one side (the right hand side in FIG. 1) of the housing 2a. The casing 43 has a main portion 43a and a cover portion 43b for closing the main portion 43a. In FIG. 1, the main portion 43a and the cover portion 43b are thermally fusion bonded. However, the main portion 43a and the cover portion 43b may be integrally formed into one unit by any other methods. A connector portion 49 is provided in the main portion 43a and arranged adjacent to the electromagnetic valves. An external connector, which is connected at one end of a wire harness (not shown), is inserted into the connector portion 49.

The terminals 3a for the electric power supply to the electric motors and the terminals 3b for the control signals are directly fixed to corresponding portions of the motor driving circuit formed on the circuit board 41. Accordingly, wiring for electric connection can be simplified and assembling process for the braking pressure control unit 1 can be made in a simpler manner. The electric connection between the valve control circuit formed on the printed circuit board 42 and the motor driving circuit formed on the printed circuit board 41 are made through bus bars 50. This structure also provides advantages of simplification for the electric connection and assembling process.

When the terminals of the electromagnetic valves as well as the terminals of the pressure sensors are directly fixed to corresponding portions of the valve control circuit formed on the circuit board 42, the wiring may not become complicated and simplification for the assembling process can be likewise realized.

The terminals 3a for the electric power supply to the motor as well as the terminals 3b for the control signals are provided in such an area of an outer periphery of each electric motor, which has an angular range of ±α less than 40° in a circumferential direction of the motor from a reference line L (which is a vertical line passing through a rotational center of the motor), as shown in FIG. 2.

As a result, even in the case that the electric motors 3-1 and 3-2 having the same specification are arranged side by side in such a way that respective motor housings 3c are close to each other (almost being in contact with each other), any interference between the terminals 3b for the control signals and the neighboring motor housing may not occur. Namely, two electric motors 3-1 and 3-2 can be arranged as close to each other as possible, to suppress the increase of the size of the braking pressure control unit.

In addition, the coil portions C of the respective electromagnetic valves, the pressure sensors 22 and 23, the electric motors 3-1 and 3-2 are housed in the casing 43 together with the printed circuit boards 41 and 42. As a result that protective covers for those components are unified into one single casing, a number of assembling processes can be reduced.

Advantages of the Embodiment

According to the above explained embodiment, the space (5) is formed, which is neighboring to the electric motors (3) and arranged at the position at the ends of the electromagnetic valves (17, 18, 19) in the direction of the motor shaft of the electric motor (3). And the printed circuit board (41) for the motor driving circuit and the printed circuit board (42) for the valve control circuit are arranged in the space (5) in the direction of the motor shaft.

Accordingly, the longitudinal length of the braking pressure control unit (1) is made smaller (shorter) and the size thereof is correspondingly reduced, so that the braking pressure control unit is less affected by the space limitations of the vehicle, when compared with the conventional braking pressure control unit in which the electric motor and the electronic control unit are arranged in the direction of the motor shaft.

According to the above explained embodiment, the printed circuit board (41) for the motor driving circuit and the printed circuit board (42) for the valve control circuit are arranged in the space (5), which is independently formed from the electric motor (3). As a result, the electronic parts are not easily affected by the heat generated at the electric motor and thereby the deterioration of those electronic parts can be suppressed, when compared with the structure in which the electronic control unit is integrally with the electric motor.

The volume of the above mentioned space (5) becomes larger, as the longitudinal length of the electric motor becomes longer in its axial direction. Accordingly, the volume of the space (5) can be optimized by selecting the optimum radius ratio of the motors, so that the step between the longitudinal rear end of the motor and the rear end of the space (5) is made as smaller as possible "close to zero". As a result, the space efficiency is increased such that the increase of the size for the braking pressure control unit is suppressed, even in case of using the brushless motors.

Furthermore, in the above explained embodiment, the printed circuit board (41) for the motor driving circuit and the printed circuit board (42) for the valve control circuit are arranged in the direction of the motor shaft in the space (5) neighboring to the electric motors (3). Accordingly, it becomes possible to fix the terminals (3a) for electric power supply and the terminals (3b) for control signals directly to the corresponding portions of the motor driving circuit. It becomes also possible to make the communication easier between the printed circuit board (41) for the motor driving circuit and the printed circuit board (42) for the valve control circuit. The simplification of the electric wiring can be thereby achieved. In addition, the process for assembling the printed circuit board (41) for the motor driving circuit and the printed circuit board (42) for the valve control circuit can be made simpler, because those printed circuit boards are arranged in the motor shaft direction.

According to the above explained embodiment, the terminals (3a, 3b) for the electric power supply and for the control signals are provided in such area, which has the angular range less than ±40° in the circumferential direction of the electric motor (3) from the reference line (L). As a result, the electric motors (3) having the same specification can be arranged side by side in a way that respective motor housings (3c) are close to each other (almost being in contact with each other). Even with such arrangement, no interference occurs between the terminals for the neighboring motor housings. Namely, it is possible to suppress the increase of the size of the braking pressure control unit.

Furthermore, according to the above explained embodiment, the pressure increasing performance is increased because the brushless motor is used, so that the response of the braking operation is improved. In addition, the large-sized electrical parts (the condenser and the coil) included in the motor driving circuit are fixed to the printed circuit board for the motor driving circuit, and arranged between the printed circuit boards for the motor driving circuit and valve control circuit. As a result, the increase of the size due to the use of the brushless motor can be suppressed to a small amount.

Furthermore, according to the above explained embodiment, the terminals (3a, 3b) for the electric power supply and for the control signals are directly fixed to the corresponding portions of the motor driving circuit. This means that the electric connection between the motor and the motor driving circuit is carried out without using the wire harness. Therefore, the simplification for the electric wiring as well as the simplification for the assembling process can be realized.

Furthermore, according to the above explained embodiment, the coil portions (C) of the electromagnetic valves (17, 18, 19), the electric motors (3), and the printed circuit boards (41, 42) for the motor driving circuit and for the valve control circuit are accommodated in the casing (43) for the electronic control unit (4). The protective covers for the respective components can be unified into one casing, to reduce the number of assembling processes.

In addition, according to the above explained embodiment, the housing (2a) is made of the aluminum-based material and the transistors (46) included in the respective motor driving circuit and valve control circuit are supported by the heat radiation plate (47) fixed to the housing (2a). Accordingly, the heat generated at the transistors is absorbed by the housing through the heat radiation plate. This means that the radiation performance for the electronic control unit is increased.

What is claimed is:
1. A braking pressure control unit for a vehicle braking system comprising:
   a plurality of pumps for respectively drawing brake fluid and for supplying the brake fluid to respective wheel cylinders;
   a hydraulic pressure control block including;
      first electromagnetic valves for opening or closing brake fluid lines, which connect a master cylinder with the wheel cylinders;
      second electromagnetic valves for opening or closing brake fluid passages, which connect the wheel cylinders to a reservoir;
      third electromagnetic valves for controlling fluid pressure of the brake fluid in the respective wheel cylinders; and
      a housing, in which valve portions of the electromagnetic valves and the pumps are arranged;
   a plurality of electric motors for respectively driving the pumps; and
   an electronic control unit for outputting control signals to the respective electromagnetic valves and to the electric motors for driving the pumps,
   wherein the electromagnetic valves are put together in a group and arranged at one side of the hydraulic pressure control block,
   wherein the electric motors are put together in a group and arranged at the same one side of the hydraulic pressure control block, so that the group for the electromagnetic valves and the group for the electric motors are arranged close to each other on the same side of the hydraulic pressure control block;
   wherein a space, which is neighboring to the electric motors and which is arranged at a position at ends of the electromagnetic valves in a direction of a motor shaft of the electric motor, is formed,
   wherein the electronic control unit is composed of a printed circuit board having a motor driving circuit for the electric motors, a printed circuit board having a valve control circuit for the electromagnetic valves, and a casing for accommodating the printed circuit boards, wherein the printed circuit boards are arranged in the space side by side in the direction of the motor shaft, wherein the electromagnetic valves and the electric motors are arranged at a steep side surface of the housing for the hydraulic pressure control block, the electric motors are arranged side by side below the group for the electromagnetic valves, so that each of the electric motors is neighboring to each other in a horizontal direction, terminals for electric power supply to the electric motors and terminals for control signals to the electric motors are provided in such an area of an outer periphery of each of the electric motors, which has an angular range less than ±40° in a circumferential direction of the electric motor from a reference line, that is a vertical line passing through a rotational center of the electric motor, the electric motors are composed of brushless motors, the motor driving circuit for the brushless motor includes a noise filter being composed of a condenser and a coil, and the condenser and the coil are fixed to the printed circuit board for the motor driving circuit, and arranged between the printed circuit boards.

2. A braking pressure control unit according to claim 1, wherein terminals for electric power supply to the electric motors and terminals for control signals to the electric motors are directly fixed to corresponding portions of the motor driving circuit formed on the printed circuit board.

3. A braking pressure control unit according to claim 2, wherein coil portions of the electromagnetic valves and the electric motors are accommodated in the casing for the electronic control unit, together with the printed circuit board for the motor driving circuit and the printed circuit board for the valve control circuit.

4. A braking pressure control unit according to claim 3, wherein the housing is made of aluminum or aluminum-based material, a heat radiation plate is fixed to the housing, and transistors included in the respective motor driving circuit and valve control circuit are supported by the heat radiation plate.

5. A braking pressure control unit for a vehicle braking system comprising:

a plurality of pumps for respectively drawing brake fluid and for supplying the brake fluid to respective wheel cylinders;

a hydraulic pressure control block including;

first electromagnetic valves for opening or closing brake fluid lines, which connect a master cylinder with the wheel cylinders;

second electromagnetic valves for opening or closing brake fluid passages, which connect the wheel cylinders to a reservoir;

third electromagnetic valves for controlling fluid pressure of the brake fluid in the respective wheel cylinders; and a housing, in which valve portions of the electromagnetic valves and the pumps are arranged;

a plurality of electric motors for respectively driving the pumps; and an electronic control unit for outputting control signals to the respective electromagnetic valves and to the electric motors for driving the pumps, wherein the electromagnetic valves are put together in a group and arranged at one side of the hydraulic pressure control block, wherein the electric motors are put together in a group and arranged at the same one side of the hydraulic pressure control block, so that the group for the electromagnetic valves and the group for the electric motors are arranged close to each other on the same side of the hydraulic pressure control block, wherein a space, which is neighboring to the electric motors and which is arranged at a position at ends of the electromagnetic valves in a direction of a motor shaft of the electric motor, is formed, wherein the electronic control unit is composed of a printed circuit board having a motor driving circuit for the electric motors, a printed circuit board having a valve control circuit for the electromagnetic valves, and a casing for accommodating the printed circuit boards, and wherein the printed circuit boards are arranged in the space side by side in the direction of the motor shaft, wherein the electric motors are composed of brushless motors, the motor driving circuit for the brushless motor includes a noise filter being composed of a condenser and a coil, and the condenser and the coil are fixed to the printed circuit board for the motor driving circuit, and arranged between the printed circuit boards.

6. A braking pressure control unit according to claim 5, wherein terminals for electric power supply to the electric motors and terminals for control signals to the electric motors are directly fixed to corresponding portions of the motor driving circuit formed on the printed circuit board.

7. A braking pressure control unit according to claim 6, wherein coil portions of the electromagnetic valves and the electric motors are accommodated in the casing for the electronic control unit, together with the printed circuit board for the motor driving circuit and the printed circuit board for the valve control circuit.

8. A braking pressure control unit according to claim 7, wherein the housing is made of aluminum or aluminum-based material, a heat radiation plate is fixed to the housing, and transistors included in the respective motor driving circuit and valve control circuit are supported by the heat radiation plate.

9. A braking pressure control unit according to claim 5, wherein coil portions of the electromagnetic valves and the electric motors are accommodated in the casing for the electronic control unit, together with the printed circuit board for the motor driving circuit and the printed circuit board for the valve control circuit.

10. A braking pressure control unit according to claim 9, wherein the housing is made of aluminum or aluminum-based material, a heat radiation plate is fixed to the housing, and transistors included in the respective motor driving circuit and valve control circuit are supported by the heat radiation plate.

11. A braking pressure control unit according to claim 5, wherein
the housing is made of aluminum or aluminum-based material,
a heat radiation plate is fixed to the housing, and
transistors included in the respective motor driving circuit and valve control circuit are supported by the heat radiation plate.

* * * * *